(12) United States Patent
Vellianitis et al.

(10) Patent No.: US 12,148,828 B2
(45) Date of Patent: Nov. 19, 2024

(54) SEMICONDUCTOR DEVICE AND MANUFACTURING METHOD THEREOF

(71) Applicant: Taiwan Semiconductor Manufacturing Co., Ltd., Hsin-Chu (TW)

(72) Inventors: Georgios Vellianitis, Heverlee (BE); Chun-Chieh Lu, Taipei (TW); Sai-Hooi Yeong, Zhubei (TW); Mauricio Manfrini, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/123,982

(22) Filed: Dec. 16, 2020

(65) Prior Publication Data

US 2021/0399136 A1 Dec. 23, 2021

Related U.S. Application Data

(60) Provisional application No. 63/040,681, filed on Jun. 18, 2020.

(51) Int. Cl.
*H01L 29/78* (2006.01)
*H01L 21/383* (2006.01)
*H01L 21/447* (2006.01)
*H01L 27/12* (2006.01)
*H01L 29/49* (2006.01)
(Continued)

(52) U.S. Cl.
CPC ...... *H01L 29/78391* (2014.09); *H01L 21/383* (2013.01); *H01L 21/447* (2013.01); *H01L 29/4908* (2013.01); *H01L 29/66969* (2013.01); *H01L 29/7869* (2013.01); *H01L 27/1207* (2013.01)

(58) Field of Classification Search
None
See application file for complete search history.

(56) References Cited

U.S. PATENT DOCUMENTS 5,851,903 A * 12/1998 Stamper ............ H01L 21/76888
438/467
2002/0153542 A1 10/2002 Gnadinger
(Continued)

FOREIGN PATENT DOCUMENTS

JP 2006121029 A 5/2006

OTHER PUBLICATIONS

Rahman et al., "Characterization of Al Incorporation into HfO2 Dielectric by Atomic Layer Deposition", Micromachines 2019, 10, 361 ; doi:10.3390/mi10060361, May 2019, p. 1-11 (Year: 2019).*
(Continued)

*Primary Examiner* — Vincent Wall
(74) *Attorney, Agent, or Firm* — Eschweiler & Potashnik, LLC

(57) ABSTRACT

A semiconductor device and a manufacturing method thereof are provided. The semiconductor device includes a gate layer, a low-doping semiconductor layer, a crystalline ferroelectric layer and source and drain terminals. The crystalline ferroelectric layer is disposed between the gate layer and the low-doping semiconductor layer. The source terminal and the drain terminal are disposed on the low-doping semiconductor layer.

20 Claims, 12 Drawing Sheets

(51) Int. Cl.
*H01L 29/66* (2006.01)
*H01L 29/786* (2006.01)

(56) References Cited

U.S. PATENT DOCUMENTS

| | | | |
|---|---|---|---|
| 2007/0241390 A1* | 10/2007 | Tanaka | H01L 29/42324 |
| | | | 257/314 |
| 2009/0061538 A1 | 3/2009 | Heo et al. | |
| 2010/0148171 A1* | 6/2010 | Hayashi | H01L 27/124 |
| | | | 257/E29.1 |
| 2014/0199837 A1* | 7/2014 | Hung | H01L 21/31144 |
| | | | 438/675 |
| 2015/0249206 A1* | 9/2015 | Kim | H10N 50/10 |
| | | | 257/421 |
| 2016/0118502 A1 | 4/2016 | Yamazaki et al. | |
| 2017/0309488 A1 | 10/2017 | Sakai et al. | |
| 2018/0286987 A1 | 10/2018 | Lee et al. | |
| 2018/0366174 A1 | 12/2018 | Liu | |
| 2019/0058049 A1 | 2/2019 | Then et al. | |
| 2019/0097061 A1 | 3/2019 | Ho et al. | |
| 2019/0130956 A1* | 5/2019 | Müller | H01L 29/0673 |
| 2019/0130957 A1* | 5/2019 | Müller | H10B 51/30 |
| 2019/0131425 A1 | 5/2019 | Lu et al. | |
| 2019/0131426 A1* | 5/2019 | Lu | H01L 29/6684 |
| 2019/0138893 A1* | 5/2019 | Sharma | G11C 7/1039 |
| 2019/0198638 A1* | 6/2019 | Van Houdt | H01L 29/66045 |
| 2019/0392758 A1 | 12/2019 | Kim et al. | |
| 2020/0027897 A1* | 1/2020 | Zhu | H10B 53/20 |
| 2020/0091274 A1* | 3/2020 | Sharma | H01L 29/4908 |
| 2020/0176457 A1* | 6/2020 | Sharma | H10B 51/40 |
| 2021/0005752 A1 | 1/2021 | Okazaki et al. | |
| 2022/0254897 A1 | 8/2022 | Tsai et al. | |

OTHER PUBLICATIONS

Yamazaki, Shunpei. "New crystalline structure yields reliable thin-film transistors" SPIE, published on Sep. 14, 2012.

Polakowski et al. "Silicon doped hafnium oxide (HSO) and hafnium zirconium oxide (H ZO) based FeFET: A material relation to device physics" Appl. Phys. Lett. 112, 222903 (2018), published on Jun. 1, 2018.

Ex-Parte Quayle Office Action dated Sep. 18, 2023, for U.S. Appl. No. 17/883,699.

Goh et al., Excellent Reliability and High-Speed Antiferroelectric HfZrO2 TunnelJunction by a High-Pressure Annealing Process and Built-in Bias Engineering ACS Appl. Mater. Interfaces 2020, 12, 57539-57546 (Year: 2020).

Notice of Allowance dated Oct. 30, 2023, for U.S. Appl. No. 17/883,699.

* cited by examiner

SEMICONDUCTOR DEVICE AND MANUFACTURING METHOD THEREOF

REFERENCE TO RELATED APPLICATION

This application claims the benefit of U.S. Provisional Application No. 63/040,681, filed on Jun. 18, 2020, the contents of which are hereby incorporated by reference in their entirety.

BACKGROUND

Semiconductor manufacturing technology involves the integration of hundreds of process steps to fabricate semiconductor devices and electronic components with increasingly sophisticated three-dimensional geometry.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
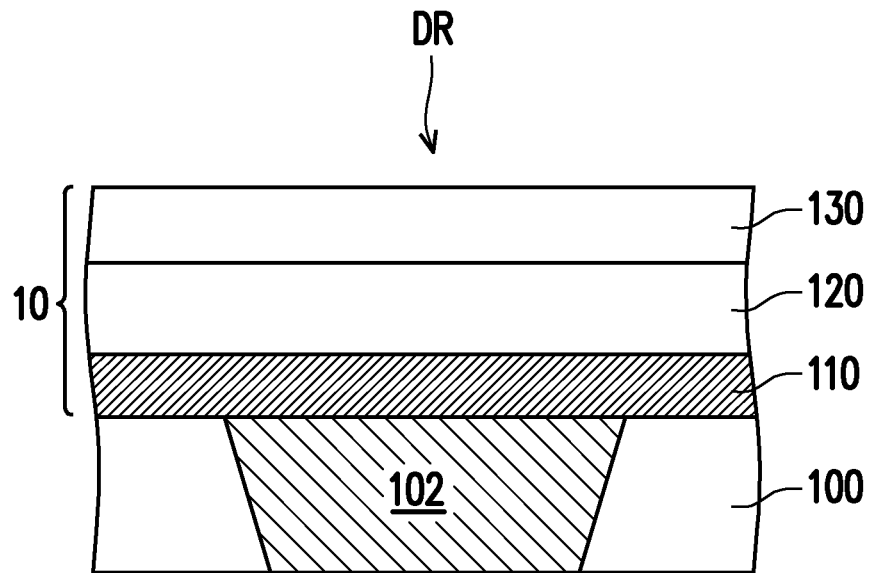
FIG. 1 to FIG. 6 are schematic cross-sectional views of various stages in a manufacturing method of a semiconductor device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

It should be appreciated that the following embodiment(s) of the present disclosure provides applicable concepts that can be embodied in a wide variety of specific contexts. The specific embodiment(s) discussed herein is merely illustrative and is related to an integration structure containing more than one type of semiconductor devices, and is not intended to limit the scope of the present disclosure. Embodiments of the present disclosure describe the exemplary manufacturing process of integration structures formed with one or more semiconductor devices such as transistors and the integration structures fabricated there-from. Certain embodiments of the present disclosure are related to the structures including semiconductor transistors and other semiconductor devices. The substrates and/or wafers may include one or more types of integrated circuits or electronic components therein. The semiconductor device(s) may be formed on a bulk semiconductor substrate or a silicon/germanium-on-insulator substrate. The embodiments are intended to provide further explanations but are not used to limit the scope of the present disclosure.

Figure 9:
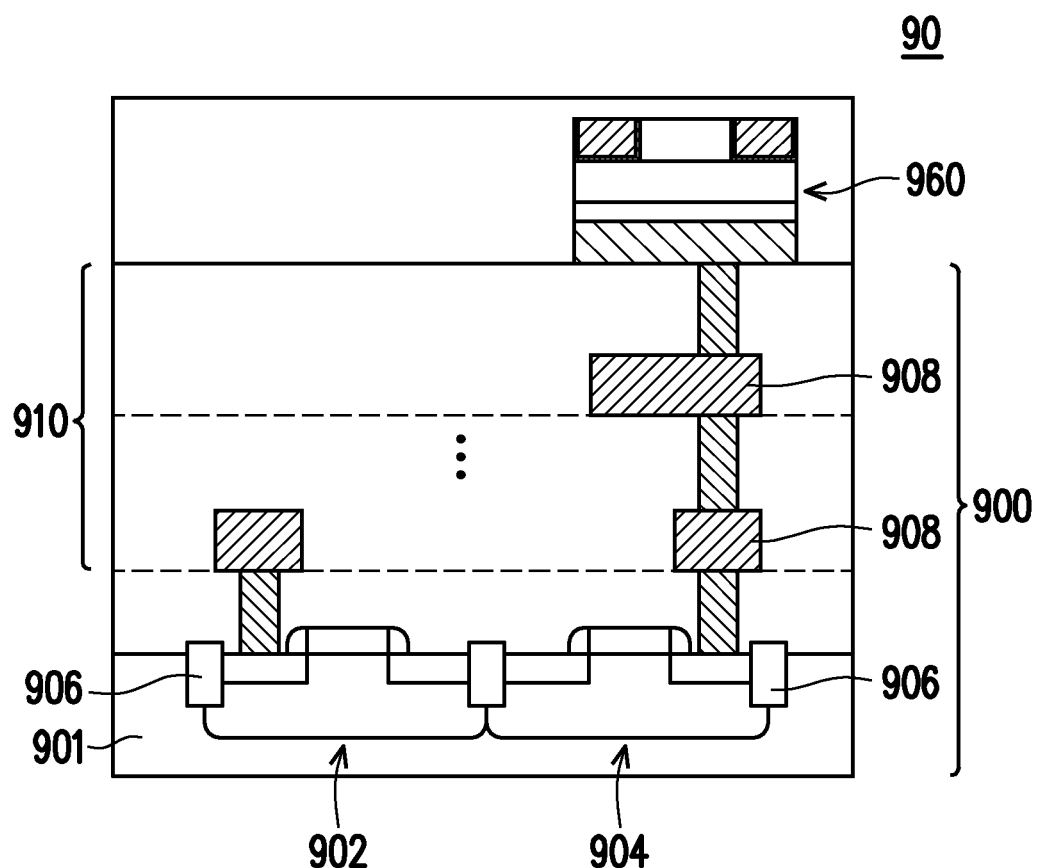
FIG. 9 is a schematic cross-sectional view showing a portion of the structure and a semiconductor device therein in accordance with some embodiments of the disclosure.

FIG. 1 through FIG. 6 are schematic cross-sectional views of various stages in a manufacturing method of a semiconductor device in accordance with some embodiments of the disclosure. From FIG. 1 through FIG. 6, schematic cross-section views of a device region DR of the integration structure are shown. FIG. 9 is a schematic cross-sectional view showing a portion of the structure and a semiconductor device therein in accordance with some embodiments of the disclosure.

Referring to FIG. 1, in some embodiments, a substrate 100 having one or more connection structure 102 therein is provided. As shown in FIG. 1, in some embodiments, the connection structure 102 (only one is shown) is formed in the substrate 100 within the device region DR. It is understood that the number of the connection structure 102 may be more than one, and the number or the configuration of the connection structure 102 should not be limited by the exemplary embodiments or drawings of this disclosure. In FIGS. 1-6, only a portion of the device region DR of the substrate 100 is shown for illustration purposes. In some embodiments, the substrate 100 also includes one or more active component such as transistors, diodes, optoelectronic devices and/or one or more passive components such as capacitors, inductors and resistors. Referring to FIG. 9, the integration structure 90 includes a substrate 900 and a semiconductor device 960 formed over the substrate 900. In some embodiments, the substrate 900 is substantially similar to the substrate 100 of FIG. 1.

Referring to FIG. 1 and FIG. 9, in some embodiments, either the substrate 100 or the substrate 900 includes a semiconductor substrate. In one embodiment, the substrate 100 or 900 comprises a crystalline silicon substrate or a doped semiconductor substrate (e.g., p-type semiconductor substrate or n-type semiconductor substrate). In certain embodiments, the substrate 100 or 900 comprises one or more doped regions or various types of doped regions, depending on design requirements. In some embodiments, the doped regions are doped with p-type and/or n-type dopants. For example, the p-type dopants are boron or BF2 and the n-type dopants are phosphorus or arsenic. The doped regions may be configured for an n-type metal-oxide-semiconductor (MOS) transistor or a p-type MOS (PMOS) transistor. In some alternative embodiments, the substrate 100 or 900 includes a semiconductor substrate made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, as shown in FIG. 9, the substrate 900 includes transistors such as a NMOS 902 and a PMOS 904 formed in the semiconductor substrate 901. In one embodiment, the NMOS 902 and/or the PMOS 904 are formed following the complementary MOS (CMOS) processes. As shown in FIG. 9, in some embodiments, more than one isolation structures 906 are formed in the semiconductor substrate 901. In certain embodiments, the isolation structures 906 are trench isolation structures. In other embodiments, the isolation structures 906 includes local oxidation of silicon (LOCOS) structures. In some embodiments, the insulator material of the isolation structures 906 includes silicon oxide, silicon nitride, silicon oxynitride, a spin-on dielectric material, or a low-k dielectric material. In one embodiment, the insulator material may be formed by CVD such as high-density-plasma chemical vapor deposition (HDP-CVD) and sub-atmospheric CVD (SACVD) or formed by spin-on. In certain embodiments, the transistors such as the NMOS 902 and the PMOS 904 and the isolation structures 906 are formed in the substrate 900 during the front-end-of-line (FEOL) processes.

In some embodiments, the substrate 900 includes metallization structures 908 embedded in an insulation layer 910. As shown in FIG. 9, the insulation layer 910 and the metallization structures 908 are located over the transistors formed in the semiconductor substrate 901. In some embodiments, the insulation layer 910 includes one or more dielectric layers. In some embodiments, a material of the insulation layer 910 includes silicon oxide, a spin-on dielectric material, a low-k dielectric material or a combination thereof. The formation of the insulation layer 910 includes performing one or more processes by chemical vapor deposition (CVD) or by spin-on, for example. In some embodiments, the metallization structures 908 include interconnect structures, such as metal lines, via and contact plugs. In certain embodiments, the materials of the metallization structures 908 include aluminum (Al), aluminum alloys, copper (Cu), copper alloys, tungsten (W), or combinations thereof. In exemplary embodiments, the transistors such as the NMOS 902 and the PMOS 904 are electrically connected with the metallization structures 908, and some of the transistors are further electrically interconnected through the metallization structures 908. The metallization structures 908 shown herein are merely for illustrative purposes, and the metallization structures 908 may include other configurations and may include one or more through vias and/or damascene structures.

Referring back to FIG. 1, in some embodiments, the connection structure 102 embedded in the substrate 100 may be a part of metallization structures in the substrate 100 for electrical connection and interconnection, and the metallization structures in the substrate 100 are similar to the metallization structures 908 as depicted in FIG. 9. In one embodiment, the connection structure 102 includes a conductive via. Herein the connection structure 102 may be optional and representatively shown for electrical connection purposes. In FIG. 1, a gate material layer 110 is blanketly formed over the substrate 100 covering the connection structure. In one embodiment, the gate material layer 110 is in direct contact with the connection structure 102. In some embodiments, the gate material layer 110 includes one or more metallic material layers. In some embodiments, the formation of the gate material layer 110 includes one or more deposition processes selected from chemical vapor deposition (CVD) (such as, plasma enhanced CVD (PECVD) and laser-assisted CVD), atomic layer deposition (ALD), and physical vapor deposition (PVD) (such as, sputtering, and e-beam evaporation). In some embodiments, the formation of the gate material layer 110 includes a plating process. In some embodiments, the gate material layer 110 is formed with a thickness ranging from about 5 nm to about 100 nm. In some embodiments, the gate material layer 110 is formed with a thickness ranging from about 1 nm to about 50 nm. In some embodiments, the materials of the gate material layer 110 include aluminum (Al), titanium (Ti), tungsten (W), tantalum (Ta), nitride thereof, combinations thereof, and/or alloys thereof. For example, the gate material layer 110 may include one or more stacked layers of TiN, TaN, W/TiN, TiN/TiAl/TiN or TiN/TiAl/TaN.

In FIG. 1, in some embodiments, a gate dielectric material layer 120 is globally formed over the gate material layer 110. In some embodiments, the gate dielectric material layer 120 includes a ferroelectric material. In certain embodiments, the material of the gate dielectric material layer 120 includes an amorphous ferroelectric material and/or a poly-crystalline ferroelectric material. In certain embodiments, the gate dielectric material layer 120 includes an amorphous ferroelectric material and a crystalline ferroelectric material. In some embodiments, the gate dielectric material layer 120 includes one or more materials selected from hafnium zirconium oxide (or hafnium oxide doped with zirconium), or hafnium oxide doped with silicon, aluminum, lanthanum (La), and/or gadolinium (Gd). In one embodiment, the material of the gate dielectric material layer 120 includes hafnium zirconium oxide, denoted as $Hf_{(x)}Zro_{(1-x)}O_2$, where x ranges from 0.1 to 0.9 ($0.1 \leq x \leq 0.9$). In one embodiment, the material of the gate dielectric material layer 120 includes silicon-doped hafnium oxide (HfSiO), aluminum-doped hafnium oxide (HfAlO), lanthanum-doped hafnium oxide (HfLaO), and/or gadolinium-doped hafnium oxide (HfGdO). In some embodiments, the formation of the gate dielectric material layer 120 includes one or more deposition processes selected from CVD (such as, PECVD and laser-assisted CVD), ALD and PVD (such as, sputtering and e-beam evaporation). For example, the gate dielectric material layer 120 may be formed by depositing a hafnium zirconium oxide layer through ALD. In some embodiments, the gate dielectric material layer 120 is formed with a thickness ranging from about 3 nm to about 20 nm.

In some embodiments, after forming the gate dielectric material layer 120, a semiconductor material layer 130 is formed over the gate dielectric material layer 120 to form a stack structure 10. In some embodiments, the material of the semiconductor material layer 130 includes a metal oxide material. In some embodiments, the formation of the semiconductor material layer 130 includes one or more deposition processes selected from CVD (such as, PECVD and laser-assisted CVD), ALD, and PVD (such as, sputtering, pulse laser deposition (PLD) and e-beam evaporation). For example, the formation of the semiconductor material layer 130 includes a CVD process or ALD process. In one embodiment, the semiconductor material layer 130 is formed with a thickness ranging from about 1 nm to about 30 nm. In some embodiments, the material of the semiconductor material layer 130 includes indium gallium zinc oxide (IGZO). In some embodiments, the material of the semiconductor material layer 130 includes a conducting oxide semiconductor material such as gallium oxide (e.g. $Ga_2O_3$), indium oxide (e.g. $In_2O_3$), zinc oxide (ZnO), titanium oxide (e.g. $TiO_2$), aluminum oxide (e.g. $Al_2O_3$), or combinations thereof.

Figure 2:
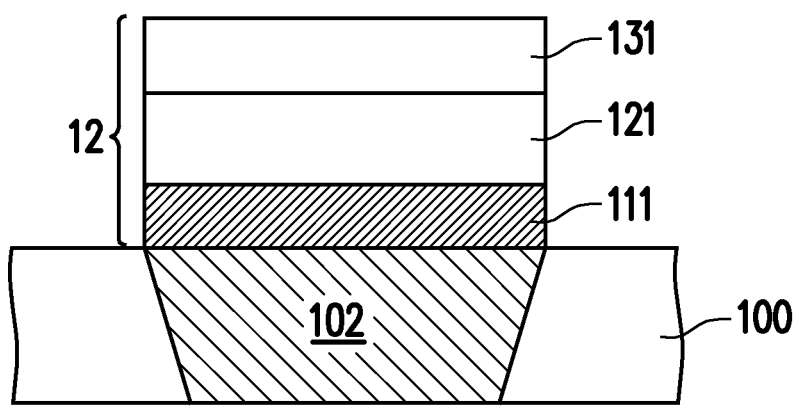

Referring to FIG. 1 and FIG. 2, in some embodiments, a patterning process is performed to the stack structure 10 of the gate material layer 110, the gate dielectric material layer 120, and the semiconductor material layer 130, so that the stack structure 10 is patterned to form a stack structure 12 having a gate layer 111, a gate dielectric layer 121, and a semiconductor layer 131 stacked in sequence from the bottom to the top. In some embodiments, the stack structure 10 of the gate material layer 110, the gate dielectric material layer 120, and the semiconductor material layer 130 is patterned into the stack structure 12 in one continuous patterning process. In some embodiments, the gate material layer 110, the gate dielectric material layer 120 and the semiconductor material layer 130 are sequentially patterned through multiple patterning processes. As shown in FIG. 2, in exemplary embodiments, the patterned stack structure 12 is disposed on the connection structure 102, exposing the substrate 100. The sidewalls of the stack structure 12 in FIG. 2 may be shown to be vertically aligned or coplanar, and the stack structure 12 may be shown to be patterned into substantially the same pattern design or configuration. However, it is understood that the various layers of the stack structure 12 may have different patterns or configurations depending on product designs. In some embodiments, the patterning and the formation of the stack structure 12 include performing a photolithographic process and an anisotropic etching process. In some embodiments, a photoresist pattern (not shown) may be used as an etching mask so that portions of the stack structure 10 uncovered by the photoresist pattern are removed during the etching process, and then the photoresist pattern is removed thorough a stripping process.

Figure 3:
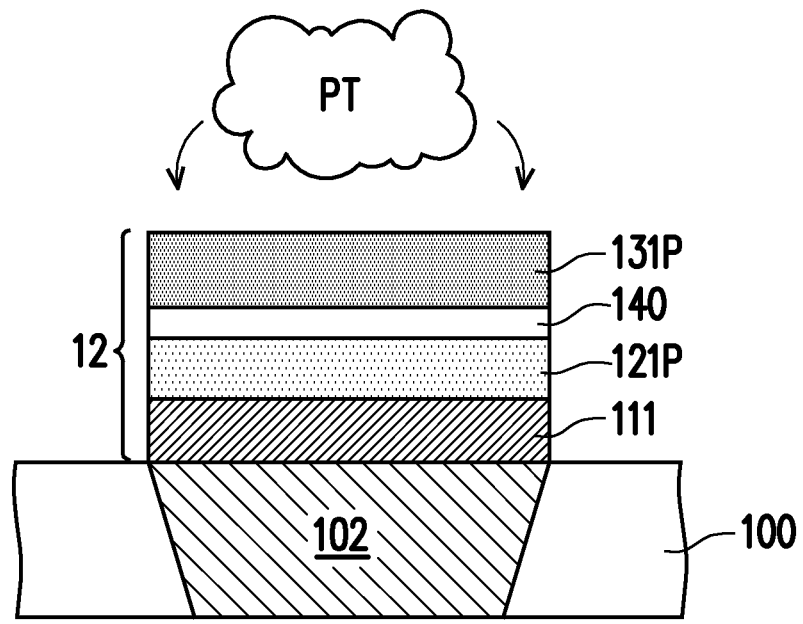

In FIG. 3, a pressurized treatment PT is performed to the semiconductor layer 131 and the gate dielectric layer 121 of the stack 12, so that the semiconductor layer 131 and the gate dielectric layer 121 are respectively transformed into a low-doping semiconductor layer 131P and a crystalline ferroelectric layer 121P with an interfacial layer 140 formed there-between. In some embodiments, the pressurized treatment PT includes performing high pressure annealing (HPA) treatment in the ambient atmosphere of oxygen gas ($O_2$). In one embodiment, the HPA treatment is performed with a processing time ranging from about 1 minute to 5 hours in an annealing chamber with a pressure at least higher than 1 atm, under the temperature range of about 300 degrees Celsius to about 450 degrees Celsius, in the ambient atmosphere of 100% $O_2$. In one embodiment, the HPA treatment is performed with a higher pressure (higher than 1 atm) and a processing time less than one hour in the annealing chamber. In one embodiment, the HPA treatment is performed with a temperature ranging from about 300 degrees Celsius to about 450 degrees Celsius, which is relatively lower than the crystallization annealing temperature. It is understood that the exposed substrate 100 either remains unchanged or may be protected during the treatment even though it is not clearly shown in the drawings or described in the contexts. In some embodiments, the gate layer 111 remains unchanged during the pressurized treatment PT as the material of the gate layer 111 is rather stable.

In some embodiments, the amorphous ferroelectric material in the gate dielectric layer 121 is transformed and becomes polycrystalline to form the crystalline ferroelectric layer 121P by way of the high pressure and lower annealing temperature used in the HPA treatment. That is, the HPA treatment crystallizes the amorphous ferroelectric material of the gate dielectric layer 121 and the gate dielectric layer 121 is tuned into a crystalline ferroelectric layer 121P. In one embodiment, the material of the crystalline ferroelectric layer 121P has more than 50% or 60% of ferroelectric phase present therein. In one embodiment, the material of the crystalline ferroelectric layer 121P has more than 70% or 80% of ferroelectric phase present therein. In one embodiment, the material of the crystalline ferroelectric layer 121P has more than 90% of ferroelectric phase present therein. For example, through the pressurized treatment PT, the amorphous hafnium zirconium oxide material of the gate dielectric layer 121 is transformed and crystallized with at least 50 percent of ferroelectric phase (e.g. orthorhombic phase) present therein. The crystalline ferroelectric layer 121P is formed with good ferroelectric property and crystallinity due to the presence of ferroelectric phase in the material. In some embodiments, for example where the ferroelectric phase comprises HfO2, the ferroelectric phase is orthorhombic phase. Certain parameters such as the material choices of the metal gate may have impact on the ferroelectric response of the ferroelectric material, since the crystal structure and strain that the gate layer 111 introduces will affect the crystallinity of the crystalline ferroelectric layer 121P. Due to the formation of the ferroelectric phase in the crystalline ferroelectric layer 121P, the ferroelectric response is achieved for the crystalline ferroelectric layer 121P. The choice of the material(s) of the gate layer 111 is not stringently limited and decoupled from the ferroelectric phase of the ferroelectric layer. In some embodiments, by way of the annealing and the oxygen environment used in the HPA treatment, the semiconductor material of the semiconductor layer 131 is cured and the oxygen vacancies of the semiconductor layer 131 are stabilized and reduced, so that the doping level of the semiconductor layer 131 is lowered (compared with untreated semiconductor layer 131) and a low-doping semiconductor layer 131P is formed. That is, less oxygen vacancies exist in the low-doping semiconductor layer 131P. In one embodiment, the low-doping semiconductor layer 131P has lower electron doping levels (for example, having a doping level value ranging from 1E17 $cm^{-3}$ to 1E19 $cm^{-3}$). Low temperature annealing is compatible with the back-end-of-line processes and is also beneficial for the semiconductor layer 131 for its low tolerance for high temperatures. By using the HPA treatment with a lower annealing temperature, the formed semiconductor layer 131 has good quality and satisfactory doping level.

Referring to FIG. 3, in some embodiments, after performing the pressurized treatment PT, the interfacial layer 140 is formed between the crystalline ferroelectric layer 121P and the low-doping semiconductor layer 131P. In one embodiment, the interfacial layer 140 is formed with a thickness ranging from about 0.1 nm to about 2 nm. Through the interaction between the gate dielectric layer 121 and the semiconductor layer 131 during the pressurized treatment PT, the interfacial layer 140 is formed with same or similar elements from the above and underlying layers. In some embodiments, the formed interfacial layer 140 includes elements or ingredients mainly from the gate dielectric layer 121. In some embodiments, the formed interfacial layer 140 includes elements or ingredients mainly from the semiconductor layer 131. In some embodiments, the formed interfacial layer 140 includes materials or elements or ingredients in varying stoichiometric ratios from both of the gate dielectric layer 121 and the semiconductor layer 131 under different reaction conditions. In some embodiments, the formed interfacial layer 140 includes compositional gradient regions, and the constituents may gradually vary from one layer to another layer. In some embodiments, the material of the interfacial layer 140 includes hafnium oxide, aluminum oxide or a combination thereof. In some embodiments, the interfacial layer 140 may be formed between the crystalline ferroelectric layer 121P and the low-doping semiconductor layer 131P without significant interfaces therebetween. For example, the interfacial layer 140 may be formed due to thermodynamic equilibrium and element diffusion. The formation of the interfacial layer 140 may help to prevent the formation of non-ferroelectric phase in the crystalline ferroelectric layer 121P and enhance the ferroelectric property of the crystalline ferroelectric layer 121P.

In some alternative embodiments, by adjusting the conditions of the pressurized treatment PT, no interfacial layer is formed between the crystalline ferroelectric layer 121P and the low-doping semiconductor layer 131P under suitable reaction conditions.

Figure 4:
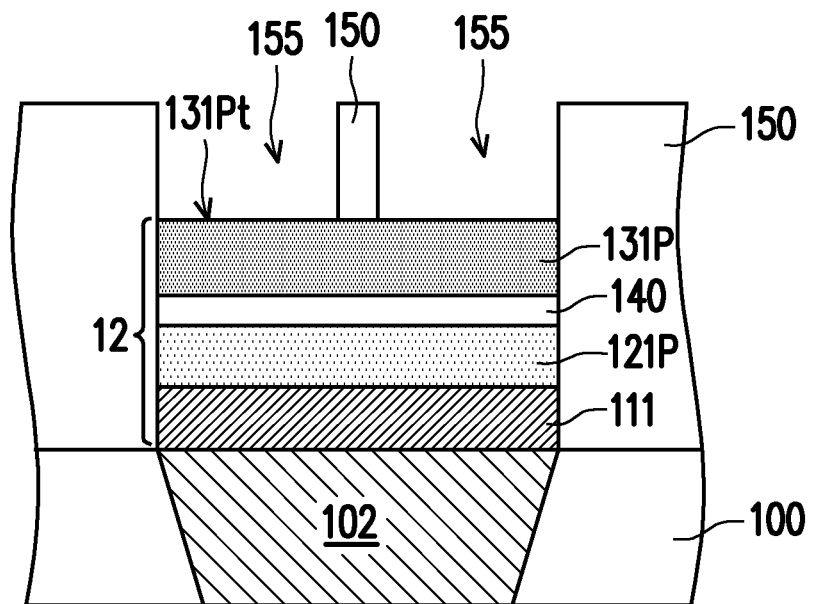

Referring to FIG. 4, an interlayer dielectric (ILD) layer 150 with contact openings 155 is formed over the substrate 100. In some embodiments, the material of the ILD layer 150 includes silicon oxide, silicon nitride, silicon oxynitride, or one or more low-k dielectric materials. Examples of low-k dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or a combination thereof. It is understood that the ILD layer 150 may include one or more dielectric materials or one or more dielectric layers. In some embodiments, the ILD layer 150 is formed to a suitable thickness through CVD (such as flowable CVD (FCVD), PECVD, high density plasma CVD (HDPCVD), sub-atmospheric CVD (SACVD) and low-pressure CVD (LPCVD)), spin-on coating, or other suitable methods. For example, the ILD layer 150 may be formed by PECVD to cover the exposed substrate 100 and the stack structure 12 having the gate layer 111, the crystalline ferroelectric layer 121P, the low-doping semiconductor layer 131P and the interfacial layer 140. Later, the contact openings 155 are formed in the ILD layer 150 exposing the low-doping semiconductor layer 131P. For example, the formation of the contact openings 155 may include forming a patterned mask layer (not shown) over the ILD layer 150, anisotropic etching the ILD layer 150 using the patterned mask layer as a mask to form contact openings 155 exposing top surface 131Pt of the low-doping semiconductor layer 131P. As seen in FIG. 4, the contact openings 155 are shown with substantially vertical sidewalls. It is understood that the contact openings may be formed with slanted sidewalls if feasible.

Figure 5:
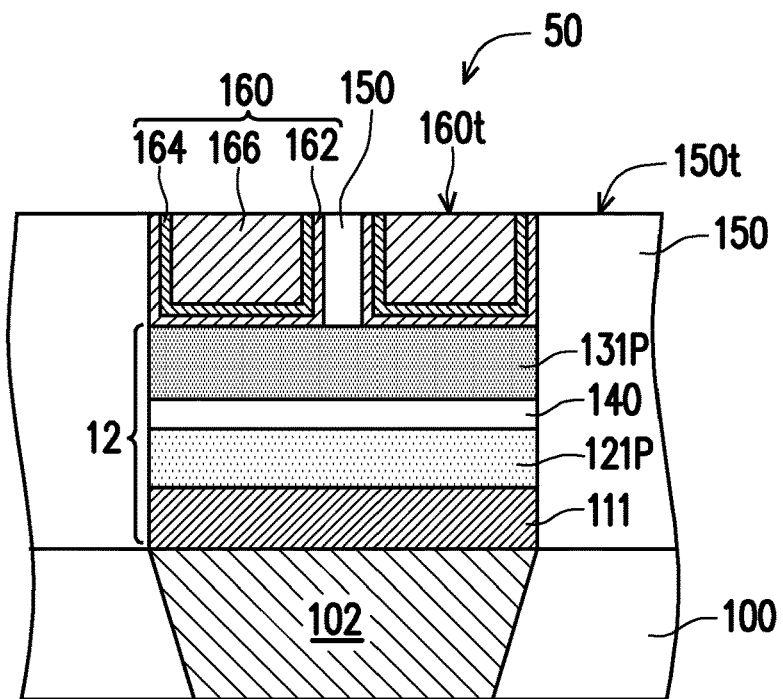

Thereafter, in FIG. 5, contact terminals 160 are formed in the contact openings 155 and are in direct contact with the low-doping semiconductor layer 131P. In some embodiments, a barrier layer 162 is deposited over the contact openings 155 and conformally covers the sidewalls of the contact openings 155 and covers the top surface 131Pt of the low-doping semiconductor layer 131P. In some embodiments, a seed layer 164 is formed over the contact openings 155 and on the barrier layer 162. In some embodiments, the barrier layer 162 is formed before forming the seed layer 164 to prevent out-diffusion of the material of the seed layer 164. After the seed layer 164 is formed to cover the sidewalls and the bottoms of the contact openings 155, metallic contacts 166 are then formed on the seed layer 164 within the contact openings 155 and fill the contact openings 155. As seen in FIG. 5, the contact terminals 160 are formed directly on the low-doping semiconductor layer 131P.

In some embodiments, a barrier material (not shown) and a seed material (not shown) are sequentially formed over the contact openings 155 and conformally covering the exposed low-doping semiconductor layer 131P and the sidewalls of the contact openings 155, and a metallic material (not shown) is then filled into the contact openings 155 and on the seed material to form the metallic contacts 166. The barrier material, the seed material and the metallic material may individually include one or more materials selected tungsten (W), ruthenium (Ru), molybdenum (Mo), tantalum (Ta), titanium (Ti), alloys thereof, and nitrides thereof, for example. In some embodiments, the barrier material is formed by CVD or PVD. In some embodiments, the seed material is formed by CVD or PVD. In some embodiments, the metallic material is formed by CVD or PVD. In alternative embodiments, the formation of the metallic material may include performing a plating process (such as electrochemical plating (ECP)). In some embodiments, the barrier material includes titanium nitride (TiN) formed by the metal organic CVD (MOCVD) process, the seed material includes tungsten formed by CVD, and the metallic material includes tungsten formed by the CVD process (especially tungsten CVD processes). For example, the metallic contact 166 includes a tungsten contact and the barrier layer 162 includes a titanium nitride barrier layer.

In some embodiments, the extra barrier material, the extra seed material and the extra metallic material may be removed by performing a planarization process, an etching process, or other suitable processes. In some embodiments, the planarization process may include performing a chemical mechanical polishing (CMP) process. In some embodiments, the barrier layer 162, the seed layer 164 and the metallic contact 166 constitute contact terminals 160. As seen in FIG. 5, the top surface 150t of the ILD layer 150 is substantially flush with and levelled with the top surfaces 160t of the contact terminals 160. In some embodiments, the contact terminals 160 function as the source and drain terminals of the transistor. In FIG. 5, a transistor structure 50 is obtained. The transistor structure 50 includes the stack structure 12 having the gate layer 111, the crystalline ferroelectric layer 121P, the interfacial layer 140 and the low-doping semiconductor layer 131P sequentially stacked from the bottom to the top, and the contact terminals 160 located on the stack structure 12. The low-doping semiconductor layer 131 functions as a channel layer of the transistor structure 50. In some embodiments, the transistor structure 50 is a bottom-gated transistor structure or a back-gate transistor structure.

A ferroelectric field effect transistor (FE-FET) is a transistor that includes a ferroelectric material sandwiched between the gate electrode and source-drain conduction region of the device. In some embodiments, the transistor structure 50 includes a ferroelectric field effect transistor (FE-FET), and the crystalline ferroelectric layer 121P functions as the gate insulator or gate dielectric layer of the transistor structure.

Figure 6:
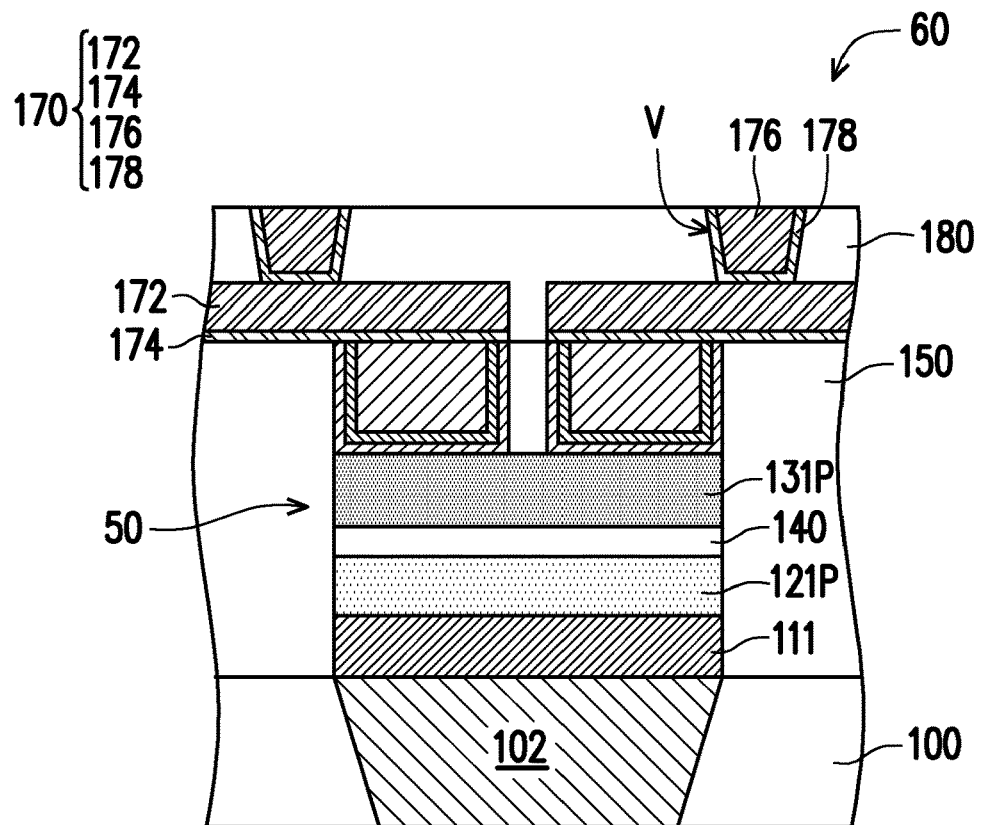

Referring to FIG. 6, in certain embodiments, an interconnecting structure 170 is formed on the ILD layer 150 and over the contact terminals 160, and the semiconductor device structure 60 is formed. In one embodiment, the interconnecting structure 170 is in direct contact with the contact terminals 160 and is electrically connected with the contact terminals 160 of the transistor structure 50, so that the transistor structure 50 is further electrical connected to other components or devices. In some embodiments, the interconnecting structure 170 includes first metal lines 172 formed on first liner layers 174 and first metal vias 176 surrounded by the second liner layers 178. In some embodiments, a first liner material (not shown) is directly formed on the ILD layer 150 and on the top surfaces 160t of the contact terminals 160, a first metal layer (not shown) is formed on the first liner material, and then the first liner material and the first metal layer are patterned into the first metal lines 172 and the first liner layers 174 using photolithographic and etching techniques. The first liner material may be formed through, for example, PVD (such as sputtering), or CVD or the like. In some embodiments, the first liner material includes, for example, tantalum, tantalum nitride, titanium, titanium nitride, tungsten, tungsten nitride, combinations thereof, or other suitable materials. In some embodiments, the first liner layers 174 may prevent out-diffusion of the material of the first metal lines 172 and/or improve the adhesion of the first metal lines 172. In some embodiments, the first metal layer may be formed by performing a plating process such as electrochemical plating (ECP) or electroless plating, a PVD process or a CVD process. In some embodiments, the first metal layer includes, for example, copper, copper-aluminum alloys, tantalum, titanium, tungsten, alloys thereof, or other suitable metal materials.

In some embodiments, as shown in FIG. 6, the first metal lines 172 are in direct contact with and electrically connected with the contact terminals 160. For example, the first metal lines 172 may include copper or copper alloys, and may be formed by performing a PVD process and a CVD process. In one embodiment, a thickness of the first metal lines 172 may be adjusted according to design requirements. As shown in FIG. 6, in certain embodiments, another ILD layer 180 is formed over the ILD layer 150 and the first metal lines 172. The materials and formation methods of the ILD layer 180 may be similar to those of the ILD layer 150 and detailed descriptions thereof shall be omitted herein for simplicity. Later, via openings V are formed in the ILD layer 180 to partially expose the underlying first metal lines 172. The method(s) for forming the via openings V are similar to the methods for forming the contact openings 155. As seen in FIG. 6, the via openings V are shown with slanted sidewalls. It is understood that the via openings may be formed with substantially vertical sidewalls if feasible.

In some embodiments, in FIG. 6, the second liner layers 178 are formed in the via openings V covering the sidewalls and the bottoms of the via openings V and then the first metal vias 176 are formed on the second liner layers 178 and within the via openings V. In some embodiments, a second liner material (not shown) is formed over the via openings V and conformally covering the exposed surfaces of the via openings V, and then a second metal layer (not shown) is formed over the ILD layer 180 and filled into the openings V. The formation methods and the materials of the second liner layers 178 are similar to those of the first liner layers 174. The formation methods and the materials of the first metal vias 176 are similar to those of the first metal lines 172. Detailed descriptions shall be skipped herein for simplicity. However, it is understood that the material of the first metal lines 172 may be different from that of the first metal vias 176, and the material of the first liner layer 174 may be different from that of the second liner layer 178.

The number and configurations of the metal lines and/or metal vias of the interconnecting structure 170 shown in FIG. 6 are merely for illustration, in some alternative embodiments, more than two metal lines or metal vias may be formed in accordance with actual design requirements. Furthermore, multiple levels of interconnecting structures may be formed for electrical connection and interconnection.

The semiconductor device structure 60 illustrates an integrated circuit, or portion thereof. In some embodiments, the semiconductor device structure 60 comprises active devices such as oxide semiconductor thin film transistors, high voltage transistors, and/or other suitable components. In some embodiments, the semiconductor device structure 60 additionally includes passive components, such as resistors, capacitors, inductors, and/or fuses. In some embodiments, additional steps may be provided before, during, and after the process steps depicted from FIG. 1 to FIG. 6, and some of the steps described above may be replaced or eliminated, for additional embodiments of the method.

In the illustrated embodiments, the described methods and structures may be formed compatible with the current semiconductor manufacturing processes. In exemplary embodiments, the described methods and structures are formed during back-end-of-line (BEOL) processes. In some embodiments, the described methods and structures may be formed during middle-of-line processes.

In the above-mentioned embodiments, through the pressurized treatment, the gate dielectric layer and the semiconductor layer are treated and transformed respectively into the crystalline ferroelectric layer and the low-doping semiconductor layer. By way of one single pressurized treatment (including HPA treatment in oxygen environment), the amorphous ferroelectric layer becomes a crystalline ferroelectric layer with good ferroelectric property and achieving the ferroelectric response. At the same time, through the single pressurized treatment performed, the semiconductor channel layer has better stability, the oxygen vacancies and the doping level of the semiconductor channel layer is tuned to the desirable level, and the threshold voltage of the ferroelectric transistor is properly set. By adjusting the parameters and/or conditions of the pressurized treatment, the properties of the crystalline ferroelectric layer and the low-doping semiconductor layer may be fine-tuned and the performance of the semiconductor device is boosted. Instead of multiple treatments, only a single pressurized treatment is performed for the fabrication of the transistor structure, which leads to improved throughput and production yield.

In some embodiments, the interfacial layer formed between the low-doping semiconductor layer and the crystalline ferroelectric layer modulates the interfacial characteristics between the low-doping semiconductor layer and the crystalline ferroelectric layer and enhances the ferroelectric property of the crystalline ferroelectric layer.

Figure 7:
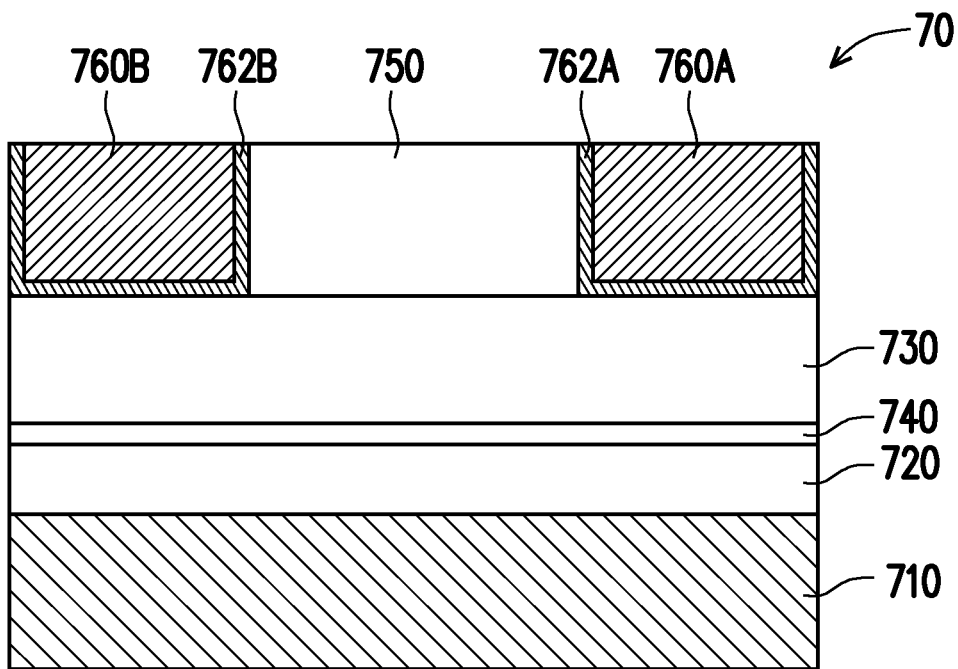
FIG. 7 and FIG. 8 are schematic cross-sectional views showing a semiconductor device in accordance with some embodiments of the disclosure.

FIG. 7 is a schematic cross-sectional view showing a semiconductor device in accordance with some embodiments of the disclosure. The exemplary structure shown in FIG. 7 may be fabricated following the process steps as described in the previous embodiments as shown from FIG. 1 to FIG. 6, but it is understood that any other compatible process steps or methods may be utilized and comprehensible modifications or adjustments may be made for forming the exemplary structure of this disclosure. Referring to FIG. 7, in some embodiments, the semiconductor device structure 70 includes a stack structure of a gate layer 710, a crystalline ferroelectric layer 720, an interfacial layer 740 and a low-doping semiconductor layer 730 sequentially stacked from the bottom to the top. In some embodiments, the semiconductor device structure 70 includes a source terminal 760A and a drain terminal 760B located on the low-doping semiconductor layer 730. In some embodiments, the source terminal 760A and the drain terminal 760B are separate from each other by an interlayer dielectric (ILD) layer 750 located there-between. In some embodiments, the source terminal 760A includes a barrier layer 762A and the drain terminal 760B also includes a barrier layer 762B. In some embodiments, the low-doping semiconductor layer 730 is in direct contact with the source terminal 760A and the drain terminal 760B. In FIG. 7, the interfacial layer 740 is sandwiched between the low-doping semiconductor layer 730 and the crystalline ferroelectric layer 720. Applicable materials for individual layers or elements are described in the previous embodiments and will not be repeated herein again.

Figure 8:
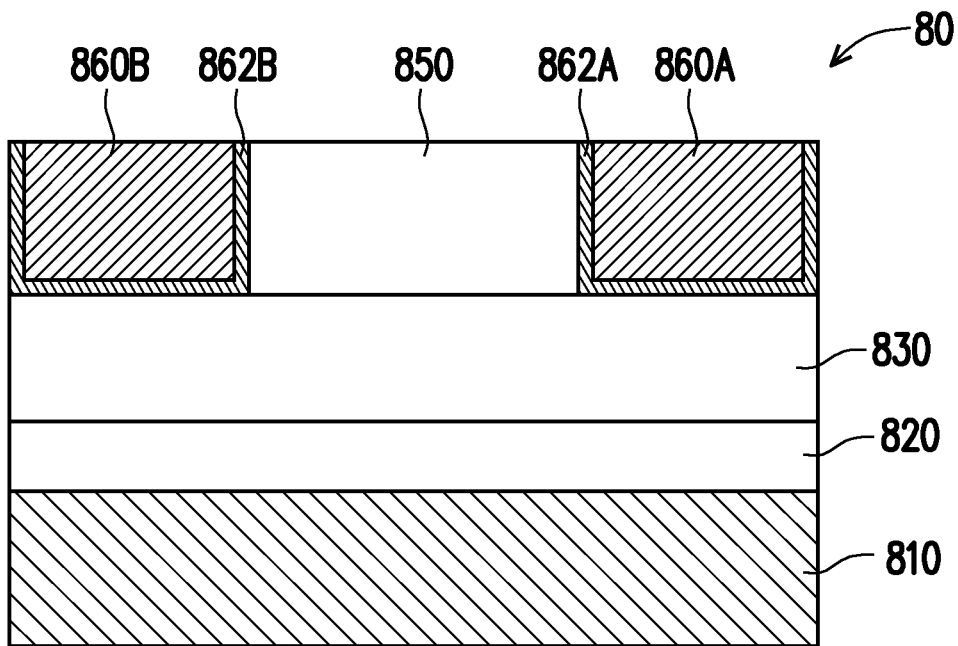

FIG. 8 is a schematic cross-sectional view showing a semiconductor device in accordance with some embodiments of the disclosure. The exemplary structure shown in FIG. 8 may be fabricated following similar process steps as described in the previous embodiments as shown from FIG. 1 to FIG. 6. However, in some embodiments, by adjusting the parameters and conditions of the pressurized treatment, no clear interfacial layer is formed. The structure shown in FIG. 8 is similar to but different from the structure shown in FIG. 7, and the main structural difference lies in the exclusion of the interfacial layer in the semiconductor device structure 80 as shown in FIG. 8. Referring to FIG. 8, in some embodiments, the semiconductor device structure 80 includes a stack structure of a gate layer 810, a crystalline ferroelectric layer 820 and a low-doping semiconductor layer 830 sequentially stacked from the bottom to the top. In some embodiments, the structure 80 includes a source terminal 860A and a drain terminal 860B located on the low-doping semiconductor layer 830. In some embodiments, the source terminal 860A and the drain terminal 860B are in contact with the low-doping semiconductor layer 830, and are separate from each other by an interlayer dielectric (ILD) layer 850. In some embodiments, the ILD layer 850 located between the source and drain terminals 860A, 860B is in direct contact with the low-doping semiconductor layer 830. In FIG. 8, the source terminal 860A includes a barrier layer 862A and the drain terminal 860B also includes a barrier layer 862B.

FIG. 10 to FIG. 15 are schematic cross-sectional views of various stages in a manufacturing method of a semiconductor device in accordance with some embodiments of the disclosure.

Figure 10:
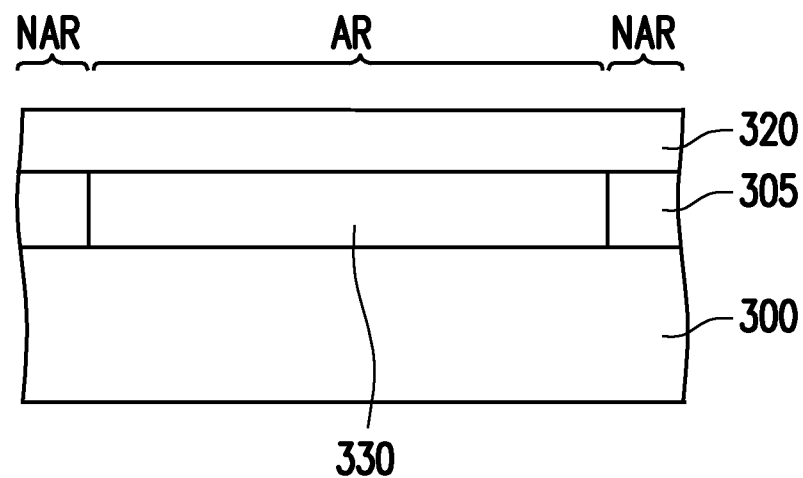
FIG. 10 to FIG. 15 are schematic cross-sectional views of various stages in a manufacturing method of a semiconductor device in accordance with some embodiments of the disclosure.

Referring to FIG. 10, in some embodiments, a substrate 300 is provided. In FIGS. 10-16, only a portion of the substrate 300 is shown for illustration purposes. In some embodiments, the substrate 300 is similar to the substrate 100, 900 in the previous embodiments, and the substrate 300 may include one or more active components such as transistors, diodes, optoelectronic devices and/or one or more passive components such as capacitors, inductors and resistors. In some embodiments, as shown in FIG. 10, a semiconductor layer 330 and isolation structures 305 are formed over the substrate 300. In some embodiments, the semiconductor layer 330 is formed by forming a semiconductor material layer (not shown) over the substrate 300 and patterning the semiconductor material layer into the semiconductor layer 330, and an active region AR is defined through the patterning process. Later, isolation structures 305 are formed in a non-active region NAR surrounding the active region AR for isolation. In one embodiment, the semiconductor layer 330 is formed with a thickness ranging from about 1 nm to about 5 nm. In some embodiments, the material of the semiconductor material layer includes indium gallium zinc oxide (IGZO). In some embodiments, the material of the semiconductor material layer includes a conducting oxide semiconductor material such as gallium oxide (e.g. $Ga_2O_3$), indium oxide (e.g. $In_2O_3$), zinc oxide (ZnO), titanium oxide (e.g. $TiO_2$), aluminum oxide (e.g. $Al_2O_3$), or combinations thereof. In some embodiments, the formation of the semiconductor material layer includes one or more deposition processes selected from CVD, ALD, and PVD. In one embodiment, the semiconductor layer 330 is made of IGZO formed by PVD. Referring to FIG. 10, in some embodiments, more than one isolation structures 305 are formed on the substrate 300. In certain embodiments, the isolation structures 305 are trench isolation structures, and the insulator material of the isolation structures 305 includes silicon oxide, silicon nitride, silicon oxynitride, a spin-on dielectric material, or a low-k dielectric material.

Referring to FIG. 10, a gate dielectric material layer 320 is formed over the semiconductor layer 330 and the isolation structures 305. In some embodiments, the gate dielectric material layer 320 includes a ferroelectric material. In certain embodiments, the material of the gate dielectric material layer 320 includes an amorphous ferroelectric material. In some embodiments, the material of the gate dielectric material layer 320 includes an amorphous ferroelectric material and a crystalline ferroelectric material. In some embodiments, the gate dielectric material layer 320 includes one or more materials selected from hafnium zirconium oxide (or hafnium oxide doped with zirconium), or hafnium oxide doped with silicon, aluminum, lanthanum (La), and/or gadolinium (Gd). In one embodiment, the material of the gate dielectric material layer 320 includes hafnium zirconium oxide, denoted as $Hf_{(x)}Zr_{(1-x)}O_2$, where x ranges from 0.1 to 0.9 ($0.1 \leq x \leq 0.9$). In one embodiment, the material of the gate dielectric material layer 320 includes silicon-doped hafnium oxide (HfSiO), aluminum-doped hafnium oxide (HfAlO), lanthanum-doped hafnium oxide (HfLaO), and/or gadolinium-doped hafnium oxide (HfGdO). In some embodiments, the formation of the gate dielectric material layer 320 includes one or more deposition processes selected from CVD (such as, PECVD and laser-assisted CVD), ALD and PVD (such as, sputtering and e-beam evaporation). For example, the gate dielectric material layer 320 may be formed by depositing a hafnium zirconium oxide layer through ALD. In some embodiments, the gate dielectric material layer 120 is formed with a thickness ranging from about 3 nm to about 20 nm.

Figure 11:
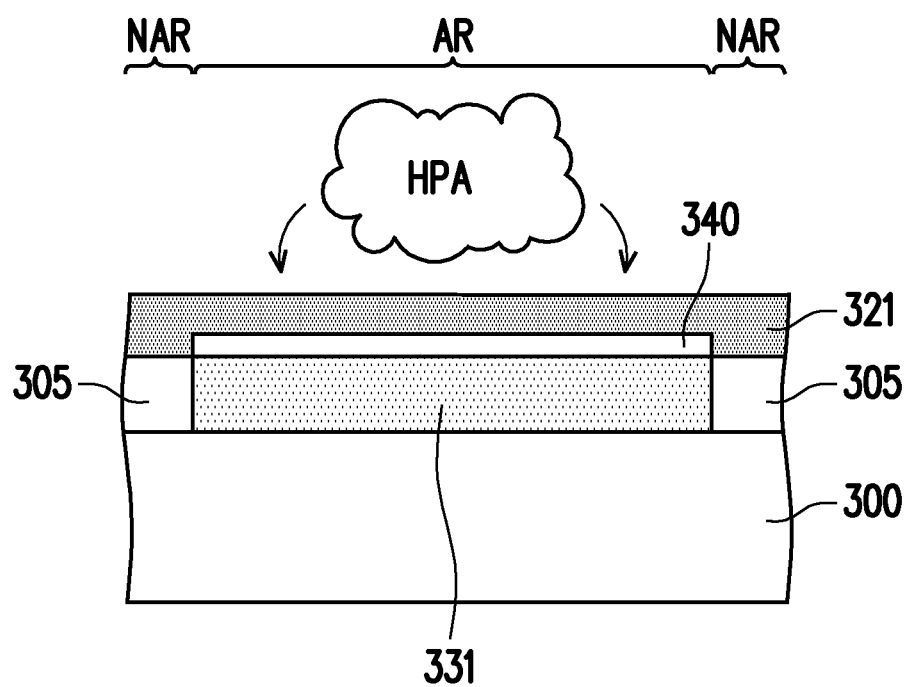

Referring to FIG. 11, a pressurized treatment PT is performed to the semiconductor layer 330 and the gate dielectric material layer 320, so that the semiconductor layer 330 and the gate dielectric material layer 320 are respectively transformed into a low-doping semiconductor layer 331 and a crystalline ferroelectric material layer 321 with an interfacial layer 340 formed there-between. As the semiconductor layer 330 is located in the active region AR, the interfacial layer 340 is mainly located in the active region AR. In some embodiments, the pressurized treatment PT includes performing high pressure annealing (HPA) treatment in the ambient atmosphere of oxygen gas ($O_2$). In one embodiment, the HPA treatment is performed with a processing time ranging from about 1 minute to 5 hours in an annealing chamber with a pressure at least higher than 1 atm, under the temperature range of about 300 degrees Celsius to about 450 degrees Celsius, in the ambient atmosphere of 100% $O_2$. In one embodiment, the HPA treatment is performed with a higher pressure (higher than 1 atm) and a processing time less than one hour in the annealing chamber. In one embodiment, the HPA treatment is performed with a temperature ranging from about 300 degrees Celsius to about 450 degrees Celsius, which is relatively lower than the crystallization annealing temperature. It is understood that the substrate 300 and the isolation structures 305 may remain unchanged during the pressurized treatment PT.

In some embodiments, the interfacial layer 340 is formed between the crystalline ferroelectric material layer 321 and the low-doping semiconductor layer 331. In one embodiment, the interfacial layer 340 is formed with a thickness ranging from about 0.1 nm to about 2 nm. In some embodiments, the formed interfacial layer 340 includes certain elements or ingredients in varying stoichiometric ratios from either one or both of the gate dielectric material layer 320 and the semiconductor layer 330 under different reaction conditions. In some embodiments, the formed interfacial layer 340 includes compositional gradient regions, and the constituents may gradually vary from one layer to another layer. In some embodiments, the material of the interfacial layer 340 includes hafnium oxide, aluminum oxide or a combination thereof. In some embodiments, the interfacial layer 340 may be formed between the crystalline ferroelectric material layer 321 and the low-doping semiconductor layer 331 without significant interfaces therebetween. For example, the formation of the interfacial layer 340 may help to prevent the formation of non-ferroelectric phase in the crystalline ferroelectric material layer 321 and enhance the ferroelectric property of the crystalline ferroelectric material layer 321.

Figure 12:
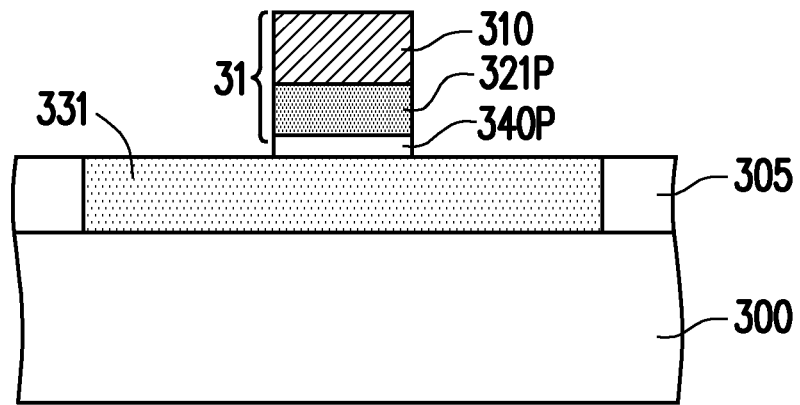

Referring to FIG. 12, a patterning process is performed to define the layers stacked on the low-doping semiconductor layer 331 to form a gate layer 310, a crystalline ferroelectric layer 321P. Following the pressurized treatment PT, a gate material layer (not shown) is formed over the crystalline ferroelectric material layer 321 and is later patterned into the gate layer 310. During the patterning process, not only the crystalline ferroelectric material layer 321 is patterned into the crystalline ferroelectric layer 321P, the interfacial layer 340 below the crystalline ferroelectric material layer 321 is also patterned into the interfacial layer 340P. In some embodiments, the gate layer 310, the crystalline ferroelectric layer 321P and the interfacial layer 340P are stacked in sequence on the low-doping semiconductor layer 331. In some embodiments, the patterning process includes photolithographic and etching processes. In some embodiments, the materials of the gate layer 310 include aluminum (Al), titanium (Ti), tungsten (W), tantalum (Ta), nitride thereof, combinations thereof, and/or alloys thereof. For example, the gate layer 310 may include one or more stacked layers of TiN, TaN, W/TiN, TiN/TiAl/TiN or TiN/TiAl/TaN. In some embodiments, the formation of the gate material layer includes one or more deposition processes selected CVD, ALD and PVD.

As shown in FIG. 12, in exemplary embodiments, the stack structure 31 of the gate layer 310, the crystalline ferroelectric layer 321P and the interfacial layer 340P disposed on the low-doping semiconductor layer 331 may be referred as the gate structure. In some embodiments, the stack structure 31 partially covers the underlying low-doping semiconductor layer 331, exposing portions of the low-doping semiconductor layer 331.

In some embodiments, as seen in FIG. 12, the stack structure 31 of the gate layer 310, the crystalline ferroelectric layer 321P and the interfacial layer 340P is located within the active region AR. The sidewalls of the stack structure 31 of the gate layer 310, the crystalline ferroelectric layer 321P and the interfacial layer 340P in FIG. 12 may be shown to be vertically aligned or coplanar, and the low-doping semiconductor layer 331 may have a different pattern from the pattern of the stack structure 31 of the gate layer 310, the crystalline ferroelectric layer 321P and the interfacial layer 340P. However, it is understood that the various layers of the stack structure may have different patterns or configurations depending on product designs.

Figure 13:
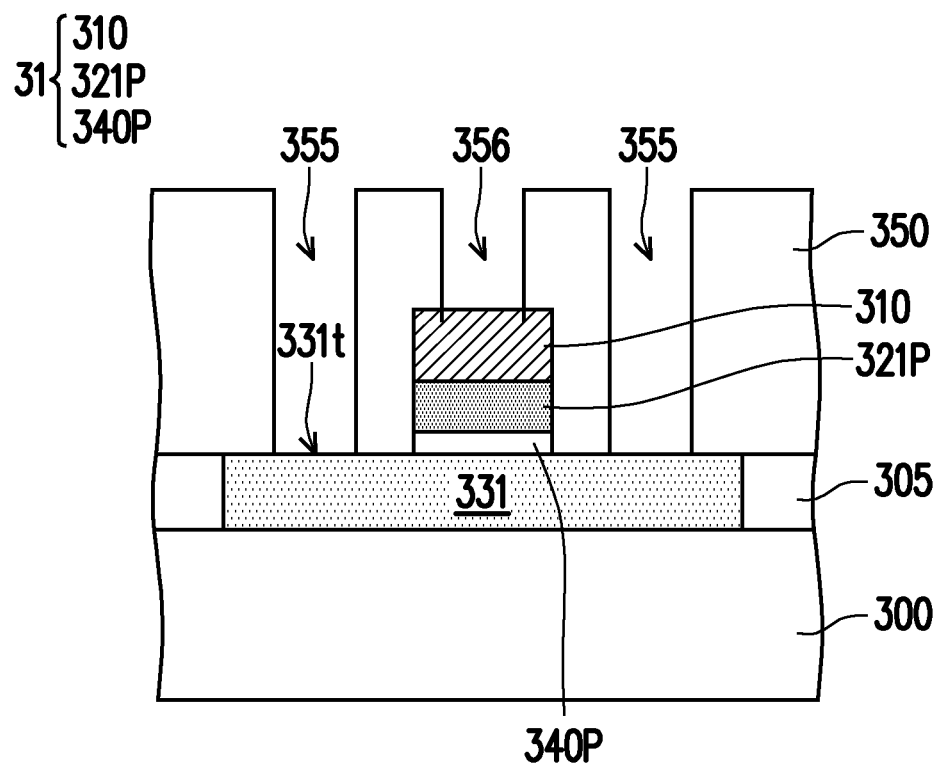

In FIG. 13, an ILD layer 350 is formed with contact openings 355, 356 over the substrate 300 covering the stack structure 31 of the gate layer 310, the crystalline ferroelectric layer 321P and the interfacial layer 340P, the exposed low-doping semiconductor layer 331 and the isolation structures 305. The materials and the formation methods of the ILD layer 350 are similar to those of the ILD layer(s) as described in the above paragraphs, and details will be omitted herein for simplicity.

Referring to FIG. 13, the contact openings 355 and 356 are formed in the ILD layer 350 to respectively expose portions of the low-doping semiconductor layer 331 and the gate layer 310. In some embodiments, the contact openings 355 expose portions of the top surface 331t of the semiconductor layer 331. In some embodiments, the contact opening(s) 356 exposes the gate layer 310. As seen in FIG. 13, the contact openings 355 and 356 are shown with substantially vertical sidewalls. It is understood that the contact openings may be formed with slanted sidewalls if feasible. The number or size of the contact opening(s) is not limited to the number or size as depicted in the drawings.

Figure 14:
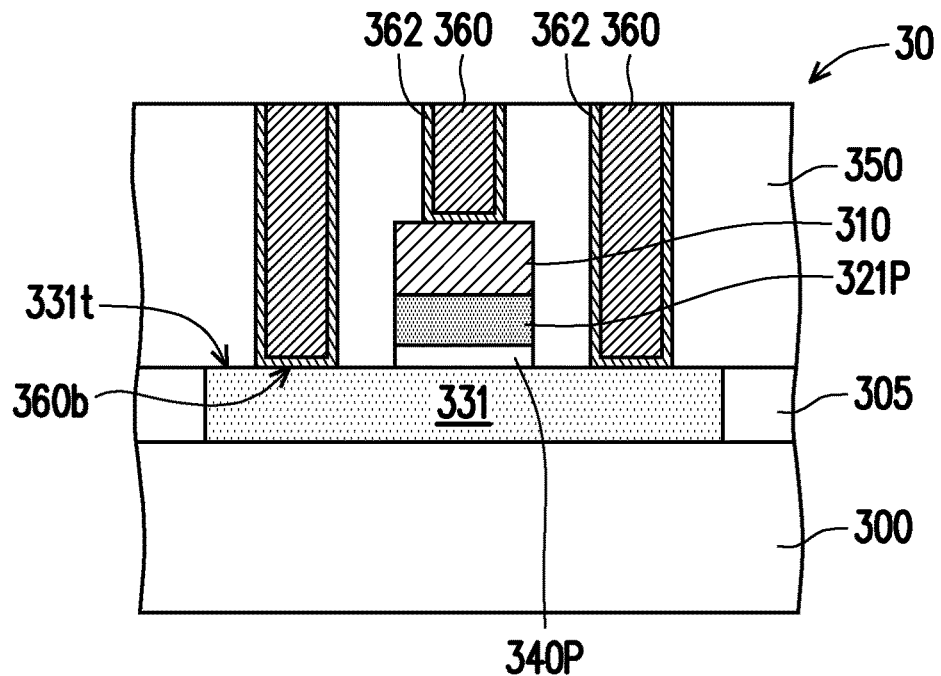

Thereafter, in FIG. 14, in some embodiments, contact terminals 360 are formed in the contact openings 355 and in the contact opening 356. In some embodiments, the contact terminals 360 formed in the contact openings 355 are respectively located directly on the low-doping semiconductor layer 331. In certain embodiments, the contact terminals 360 are formed directly on the top surface 331t of the low-doping semiconductor layer 331, and the bottom surfaces 360b of the contact terminals 360 are in direct contact with the top surface 331t of the low-doping semiconductor layer 331 in the contact openings 355. In certain embodiments, a barrier layer 362 is deposited over the contact openings 355, 356 and conformally covers the sidewalls and bottoms of the contact openings 355, 356. Similar materials and formation methods for forming the contact terminals 160 may be used for forming the contact terminals 360, and the contact terminals 360 may be formed with seed layer and/or adhesion layer, but the details shall be skipped herein for simplicity. In some embodiments, the contact terminal 360 formed in the contact opening 356 is directly connected to the gate layer 310.

Referring to FIG. 14, in some embodiments, a transistor structure 30 is obtained and the contact terminals 360 function as the source and drain terminals of the transistor. In FIG. 14, the transistor structure 30 includes the low-doping semiconductor layer 331, the stack structure 31 of the gate layer 310, the crystalline ferroelectric layer 321P and the interfacial layer 340P, and the contact terminals 360 located on the semiconductor layer 331. The low-doping semiconductor layer 331 functions as a channel layer, and the interfacial layer 340P located between the crystalline ferroelectric layer 321P and the low-doping semiconductor layer 331 helps enhancing the ferroelectric property of the crystalline ferroelectric layer 321P. In some embodiments, the transistor structure 30 is a top-gated transistor structure or a front gate transistor structure.

Figure 15:
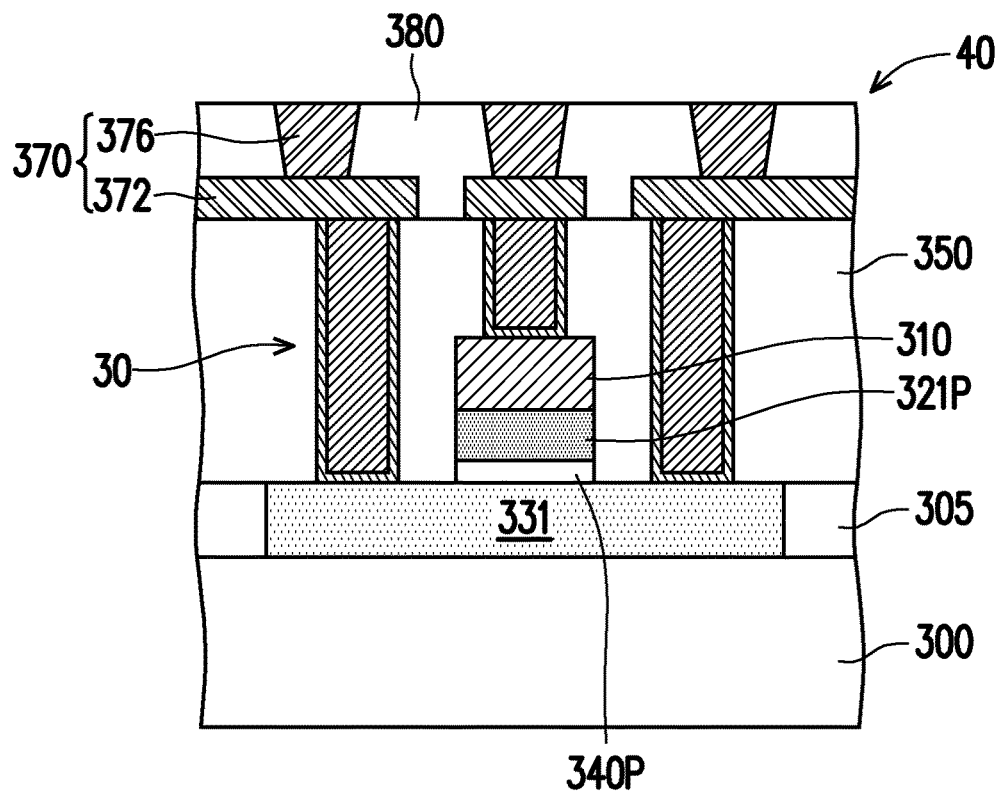

Referring to FIG. 15, in certain embodiments, an interconnecting structure 370 and another ILD layer 380 are formed on the ILD layer 350, and the semiconductor device structure 40 is formed. In some embodiments, the interconnecting structure 370 is formed on and in direct contact with the contact terminals 360, and is electrically connected with the contact terminals 360 of the transistor structure 30, so that the transistor structure 30 is further electrical connected to other components or devices. In some embodiments, the interconnecting structure 370 includes metal lines 372 and metal vias 376 connected to the metal lines 372. Similar materials and formation methods for forming the interconnecting structure 170 may be used for forming the interconnecting structure 370, and the interconnecting structure 370 may be formed with the liner layer(s), seed layer and/or barrier/adhesion layer, and multiple levels of interconnecting structures may be formed for electrical connection and interconnection.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

Figure 16:
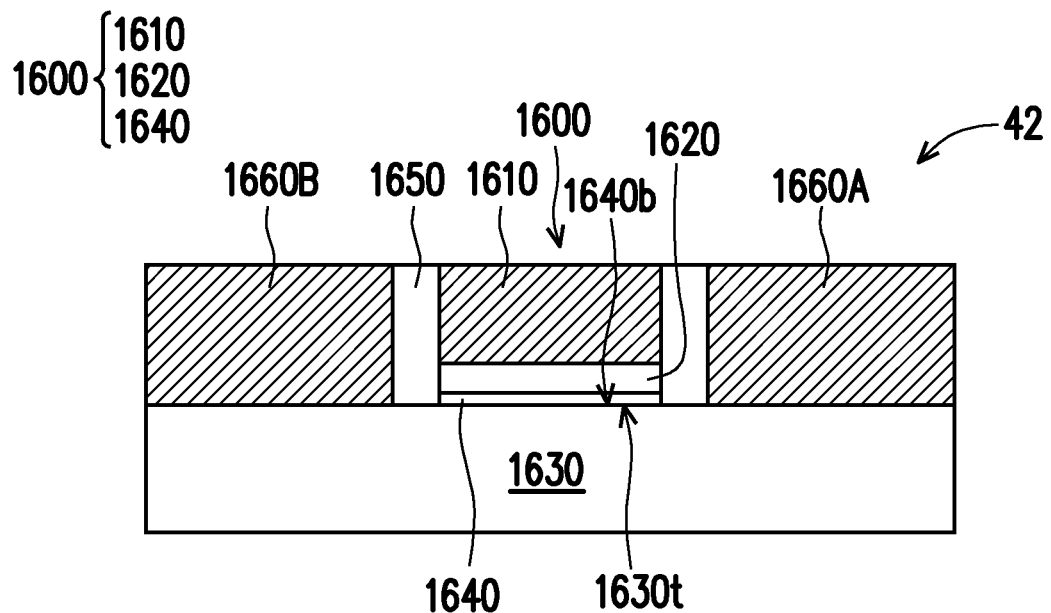
FIG. 16 and FIG. 17 are schematic cross-sectional views showing a semiconductor device in accordance with some embodiments of the disclosure.

FIG. 16 is a schematic cross-sectional view showing a semiconductor device in accordance with some embodiments of the disclosure. Referring to FIG. 16, in some embodiments, the semiconductor device structure 42 includes a gate structure 1600 of a gate layer 1610, a crystalline ferroelectric layer 1620 and an interfacial layer 1640 sequentially stacked on a low-doping semiconductor layer 1630 (from the top to the bottom). In some embodiments, the semiconductor device structure 42 includes a source terminal 1660A and a drain terminal 1660B located directly on the low-doping semiconductor layer 1630. In some embodiments, the source terminal 1660A and the drain terminal 1660B are located at two opposite sides of the gate structure 1600 and are separate from the gate structure 1600 by an interlayer dielectric (ILD) layer 1650 located therebetween. In some embodiments, the source terminal 1660A and the drain terminal 1660B may further include seed layer(s) and/or adhesion/barrier layer(s). In some embodiments, the interfacial layer 1640 touches and adjoins the crystalline ferroelectric layer 1620 and the low-doping semiconductor layer 1630. In some embodiments, the ILD layer 1650 sandwiched between the source terminal 1660A and the drain terminal 1660B is located directly on the low-doping semiconductor layer 1630. In FIG. 16, the bottom surface 1640b of the interfacial layer 1640 is in contact with the top surface 1630t of the low-doping semiconductor layer 1630.

Figure 17:
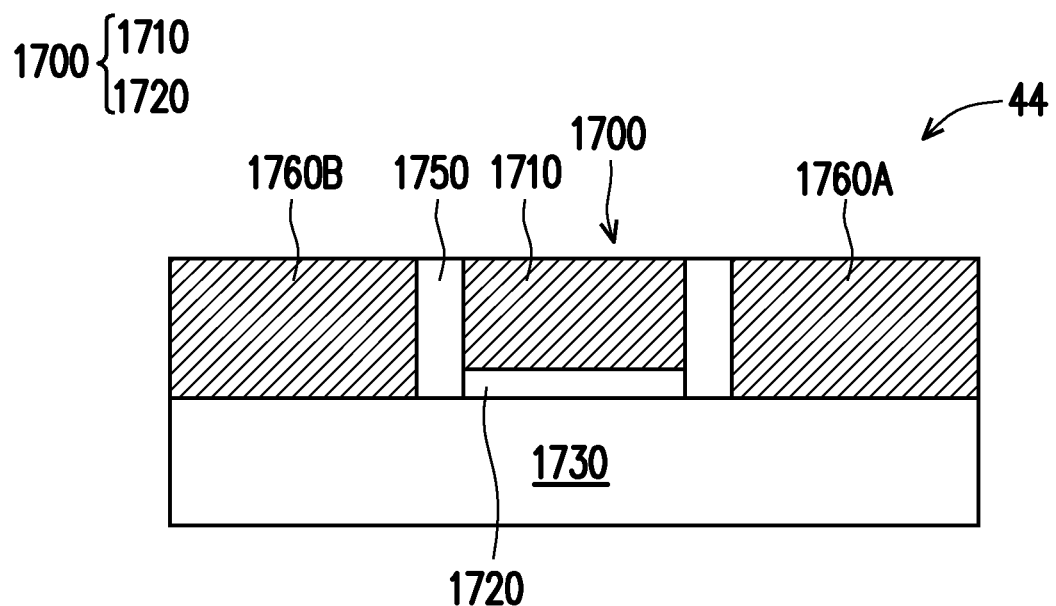

FIG. 17 is a schematic cross-sectional view showing a semiconductor device in accordance with some embodiments of the disclosure. The structure shown in FIG. 17 is similar to but different from the structure shown in FIG. 16, and the main structural difference lies in that the interfacial layer is absent in the semiconductor device structure 44 as shown in FIG. 17. Referring to FIG. 17, in some embodiments, the semiconductor device structure 44 includes a gate structure 1700 of a gate layer 1710 and a crystalline ferroelectric layer 1720 stacked on a low-doping semiconductor layer 1730. In some embodiments, the structure 44 includes a source terminal 1760A and a drain terminal 1760B located directly on the low-doping semiconductor layer 1730. In some embodiments, the source terminal 1760A and the drain terminal 1760B are physically separate from (but electrically connected with) the underlying low-doping semiconductor layer 1730. In some embodiments, the gate structure 1700 is covered by an ILD layer 1750, and the crystalline ferroelectric layer 1720 is in direct contact with the semiconductor layer 1730.

Figure 18:
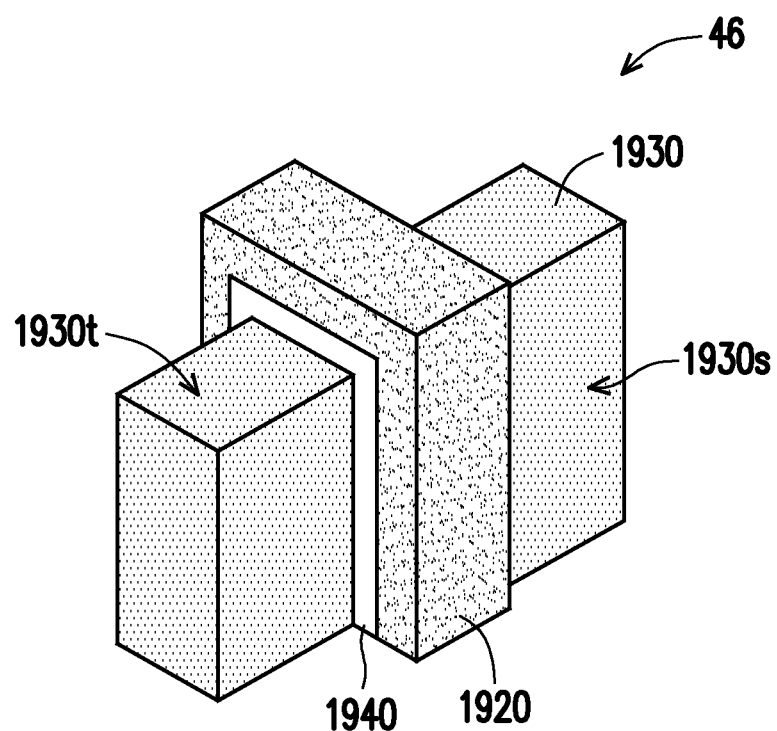
FIG. 18 and FIG. 19 are schematic three-dimensional views showing a semiconductor device in accordance with some embodiments of the disclosure.
Figure 19:
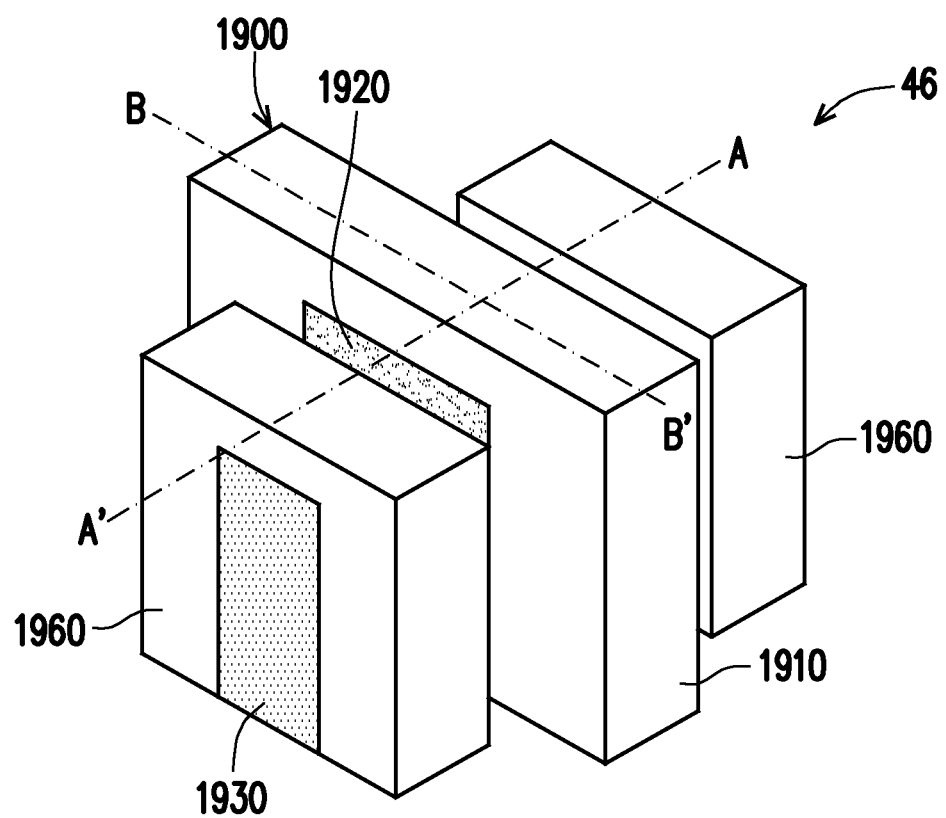
Figure 20:
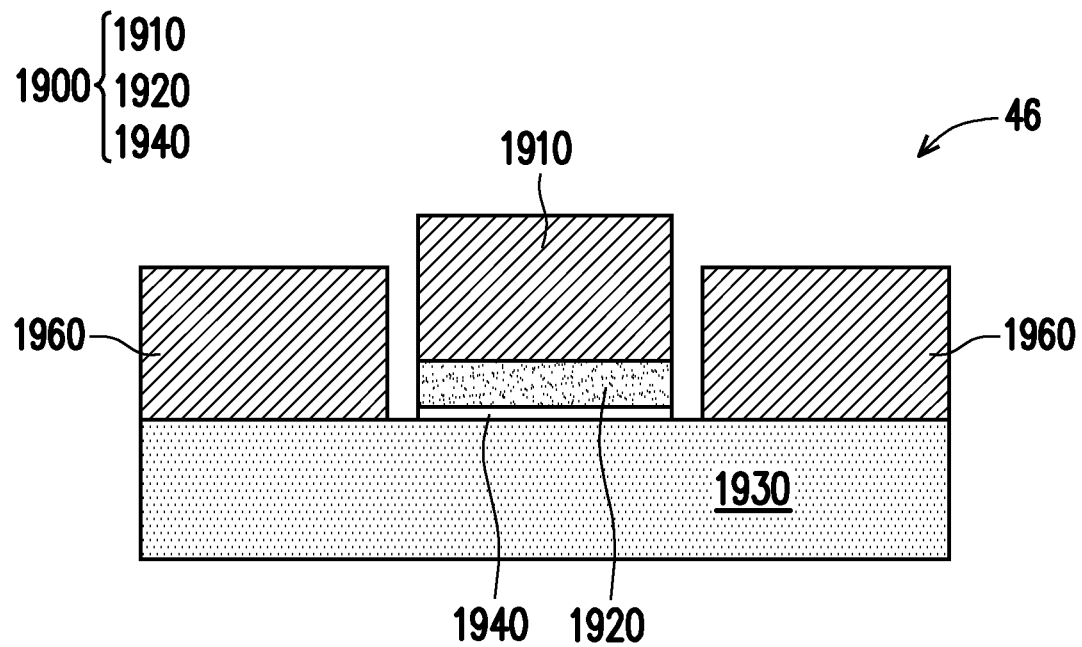
FIG. 20 and FIG. 21 are schematic cross-sectional views showing the semiconductor device in accordance with some embodiments of the disclosure.
Figure 21:
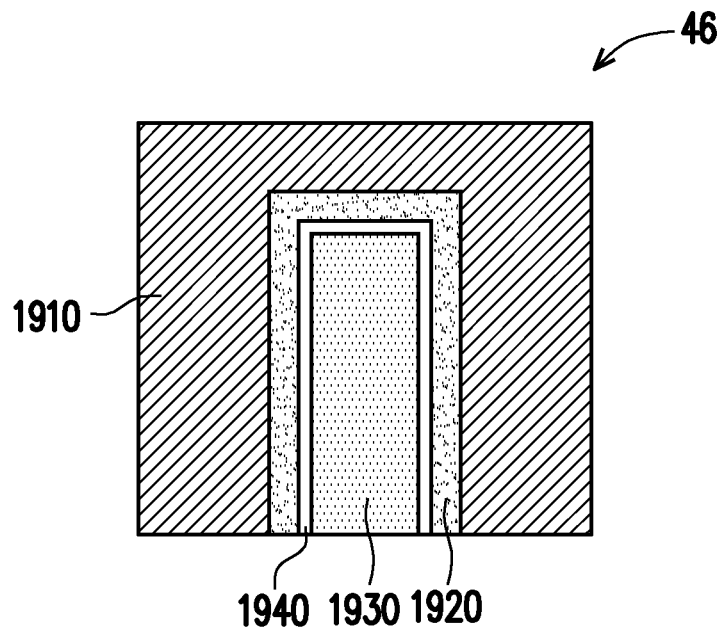

FIG. 18 and FIG. 19 are schematic three-dimensional views showing a semiconductor device in accordance with some embodiments of the disclosure. FIG. 18 shows the structure before the source and drain terminals are formed, while FIG. 19 shows the structure after the source and drain terminals are formed. FIG. 20 and FIG. 21 are schematic cross-sectional views respectively along the lines A-A' and B-B' showing the semiconductor device of FIG. 19 in accordance with some embodiments of the disclosure.

Referring to FIG. 18, in some embodiments, the semiconductor device structure 46 includes a low-doping semiconductor layer 1930, a crystalline ferroelectric layer 1920 is located on and surrounds the low-doping semiconductor layer 1930 and an interfacial layer 1940 located between the low-doping semiconductor layer 1930 and the crystalline ferroelectric layer 1920. From FIG. 18, FIG. 19, FIG. 20 and FIG. 21, it is seen that the interfacial layer 1940 occupies the interface between the low-doping semiconductor layer 1930 and crystalline ferroelectric layer 1920 and extends over not just the top surface 1930t but also two opposite side surfaces 1930s of the low-doping semiconductor layer 1930. In some embodiments, the inverted U-shaped gate layer 1910, the inverted U-shaped crystalline ferroelectric layer 1920 and the inverted U-shaped interfacial layer 1940 surround the low-doping semiconductor layer 1930, and the interfacial layer 1940 physically contacts the top surface 1930t and the two opposite side surfaces 1930s of the low-doping semiconductor layer 1930. That is, the interfacial layer 1940 covers at least three sides of the low-doping semiconductor layer 1930 and is surrounded by the crystalline ferroelectric layer 1920 and the gate layer 1910. Referring to FIG. 19, FIG. 20 and FIG. 21, a gate structure 1900 of the gate layer 1910, the crystalline ferroelectric layer 1920 and the interfacial layer 1940 is disposed on and surrounds the top side and the two opposite sides of the low-doping semiconductor layer 1930. Referring to FIG. 19 and FIG. 21, in some embodiments, the gate structure 1900 may have an inverted U shape wrapping around the semiconductor layer 1930. In some embodiments, the semiconductor device structure 46 includes source and drain terminals 1960 located directly on the low-doping semiconductor layer 1930, and the source and drain terminals 1960 each may have an inverted U shape wrapping around the low-doping semiconductor layer 1930. In some embodiments, the source and drain terminals 1960 are located at two opposite sides of the gate structure 1900 and are separate from the gate structure 1900 by an interlayer dielectric (ILD) layer (not shown) located therebetween. In FIG. 19, FIG. 20 and FIG. 21, the ILD layer is not shown for simplicity. In some embodiments, the source and drain terminals 1960 may further include seed layer(s) and/or adhesion/barrier layer(s). In some embodiments, the semiconductor device structure 46 includes a double-gated transistor structure.

In the exemplary embodiments, the formation of the interfacial layer between the channel layer (e.g. the low-doping semiconductor layer) and the crystalline ferroelectric layer enhances the ferroelectric property of the ferroelectric layer. Overall, the performance of the semiconductor device is enhanced.

In some embodiments of the present disclosure, a semiconductor device is described. The semiconductor device includes a gate layer, a low-doping semiconductor layer, a crystalline ferroelectric layer and source and drain terminals. The crystalline ferroelectric layer is disposed between the gate layer and the low-doping semiconductor layer. The source terminal and the drain terminal are disposed on the low-doping semiconductor layer.

In some embodiments of the present disclosure, a semiconductor device is described. The semiconductor device includes a semiconductor material layer, a gate layer, a ferroelectric layer, an interfacial layer and a source and a drain. The gate layer is disposed over the semiconductor material layer. The ferroelectric layer is disposed between the gate layer and the semiconductor material layer. The interfacial layer is disposed between the ferroelectric layer and the semiconductor material layer. The source and the drain are disposed on the semiconductor material layer. The interfacial layer includes at least one of materials of the semiconductor material layer and the ferroelectric layer.

In some embodiments of the present disclosure, a method for forming a semiconductor device is described. A semiconductor layer is formed and a dielectric layer is formed. A pressurized treatment is performed to transform the semiconductor layer into a low-doping semiconductor layer and transform the dielectric layer into a crystalline ferroelectric layer. A gate layer is formed. An insulating layer is formed over the gate layer, the crystalline ferroelectric layer and the low-doping semiconductor layer. Contact openings are formed in the insulating layer exposing portions of the low-doping semiconductor layer. Source and drain terminals are formed on the low-doping semiconductor layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate layer;
   an aluminum oxide semiconductor layer comprising aluminum oxide;
   a ferroelectric gate dielectric layer comprising $Hf_xZn_{1-x}O_2$ disposed between the gate layer and the aluminum oxide semiconductor layer, wherein x is greater than or equal to 0.1 and less than or equal to 0.9;
   an interfacial layer located between the aluminum oxide semiconductor layer and the ferroelectric gate dielectric layer, the interfacial layer having a thickness greater than 0.1 nanometers and less than 1 nanometers and being less than 10% of a thickness of the ferroelectric gate dielectric layer, the interfacial layer comprising elements of both the aluminum oxide semiconductor layer and the ferroelectric gate dielectric layer in varying stoichiometric ratios over a thickness of the interfacial layer between the aluminum oxide semiconductor layer and the gate dielectric ferroelectric layer;
   wherein the interfacial layer is formed by performing a pressurized treatment while an aluminum oxide semiconductor material layer and a ferroelectric material layer are in place over the gate layer, whereby the pressurized treatment transforms the aluminum oxide semiconductor material layer into the aluminum oxide semiconductor layer such that the aluminum oxide semiconductor layer has an electron doping value that is less than that of the aluminum oxide semiconductor material layer and that ranges from 1E17 cm-3 to 1E19 cm-3, and whereby the pressurized treatment also transforms the ferroelectric material layer into the ferroelectric gate dielectric layer such that the ferroelectric gate dielectric layer is a crystalline ferroelectric layer; and
   a source terminal and a drain terminal disposed on the aluminum oxide semiconductor layer and spaced apart from one another by a distance, the source terminal and drain terminal each including a metallic core, a seed layer arranged along outer sidewalls of the metal core and separating the metallic core from the aluminum oxide semiconductor layer, and a barrier layer arranged along outer sidewalls of the seed layer and separating the seed layer from the aluminum oxide semiconductor layer.

2. The semiconductor device of claim 1, wherein the interfacial layer includes a first material of the aluminum oxide semiconductor layer and a second material of the ferroelectric gate dielectric layer.

3. The semiconductor device of claim 1, wherein the source terminal and the drain terminal are located at two opposite sides of a gate stack of the gate layer and the ferroelectric gate dielectric layer, and three sides of the aluminum oxide semiconductor layer are covered by the gate stack and the source terminal and the drain terminal.

4. The semiconductor device of claim 1, wherein the ferroelectric gate dielectric layer is polycrystalline.

5. The semiconductor device of claim 1, further comprising:
   a gate contact having tapered outer sidewalls and contacting a surface of the gate layer opposite the ferroelectric gate dielectric layer, wherein a first portion of the gate contact has a first width that is equal to a width of the gate layer and defined between a first portion of the tapered outer sidewalls which are nearest the gate layer, and wherein a second portion of the gate contact has a second width defined between a second portion of the tapered outer sidewalls which are furthest from the gate layer, the second width being less than the first width.

6. The semiconductor device of claim 1, further comprising:
   an interlayer dielectric surrounding the gate layer, the aluminum oxide semiconductor layer, the interfacial layer, the source terminal, and the drain terminal, wherein the interlayer dielectric extends continuously across the distance from an outer sidewall of the barrier layer of the source terminal to an outer sidewall of the barrier layer of the drain terminal, and wherein the interlayer dielectric has an upper surface that is level with an upper surface of the barrier layer of the source terminal and is level with an upper surface of the barrier layer of the drain terminal.

7. A semiconductor device, comprising:
a semiconductor layer;
a gate electrode disposed over the semiconductor layer;
a ferroelectric layer disposed between the gate electrode and the semiconductor material layer, wherein the ferroelectric layer comprises $Hf_xZn_{1-x}O_2$ wherein x is greater than or equal to 0.1 and less than or equal to 0.9;
an interfacial layer disposed between the ferroelectric layer and the semiconductor layer; the interfacial layer having a thickness greater than 0.1 nanometers and less than 1 nanometers and being less than 10% of a thickness of the ferroelectric layer;
wherein the interfacial layer is formed by performing a pressurized treatment while a semiconductor material layer and a ferroelectric material layer are in place over the gate electrode, whereby the pressurized treatment transforms the semiconductor material layer into the semiconductor layer such that the semiconductor layer has an electron doping value that is less than that of the semiconductor material layer and that ranges from 1E17 cm-3 to 1E19 cm-3, and whereby the pressurized treatment also transforms the ferroelectric material layer into the ferroelectric layer such that the ferroelectric layer has a crystalline lattice structure; and
a source and a drain disposed on the semiconductor layer and spaced apart from one another by a distance, the source and the drain each including a metallic core, a seed layer arranged along outer sidewalls of the metal core and separating the metallic core from the semiconductor layer, and a barrier layer arranged along outer sidewalls of the seed layer and separating the seed layer from the semiconductor layer;
wherein the interfacial layer includes materials of both the semiconductor material layer and the ferroelectric layer in varying stoichiometric ratios at varying depths in the interfacial layer;
a gate contact having tapered outer sidewalls and contacting a surface of the gate electrode opposite the ferroelectric layer, wherein a first portion of the gate contact has a first width that is equal to a width of the gate electrode and defined between a first portion of the tapered outer sidewalls which are nearest the gate electrode, and wherein a second portion of the gate contact has a second width defined between a second portion of the tapered outer sidewalls which are furthest from the gate electrode, the second width being less than the first width.

8. The semiconductor device of claim 7, wherein a material of the interfacial layer includes hafnium oxide, aluminum oxide or a combination thereof.

9. The semiconductor device of claim 7, wherein the source and the drain are located at one side of the semiconductor material layer that is opposite to the other side of the semiconductor material layer that the gate electrode is located at.

10. The semiconductor device of claim 7, wherein the semiconductor material layer comprises aluminum oxide; and the interfacial layer comprises elements of both the semiconductor material layer and the ferroelectric layer in varying stoichiometric ratios over a thickness of the interfacial layer between the semiconductor material layer and the ferroelectric layer.

11. A semiconductor device, comprising:
an aluminum oxide semiconductor layer comprising aluminum oxide;
a gate electrode disposed on a first side of the aluminum oxide semiconductor layer;
a ferroelectric layer comprising hafnium zirconium oxide ($Hf_xZn_{1-x}O_2$) disposed between the gate electrode and the aluminum oxide semiconductor layer disposed between the gate electrode and the aluminum oxide semiconductor layer, wherein x is greater than or equal to 0.1 and less than or equal to 0.9;
an interfacial layer disposed between the hafnium zirconium oxide ferroelectric layer and the aluminum oxide semiconductor layer, the interfacial layer comprising elements of both the aluminum oxide semiconductor layer and the hafnium zirconium oxide ferroelectric layer in varying stoichiometric ratios over a thickness of the interfacial layer between the aluminum oxide semiconductor layer and the hafnium zirconium oxide ferroelectric layer, the interfacial layer having a thickness greater than 0.1 nanometers and less than 1 nanometers and being less than 10% of a thickness of the ferroelectric layer;
wherein the interfacial layer is formed by performing a pressurized treatment while a semiconductor material layer and a ferroelectric material layer are in place over the gate electrode, whereby the pressurized treatment transforms the semiconductor material layer into the aluminum oxide semiconductor layer such that the aluminum oxide semiconductor layer has an electron doping value that is less than that of the semiconductor material layer and that ranges from 1E17 cm-3 to 1E19 cm-3, and whereby the pressurized treatment also transforms the ferroelectric material layer into the ferroelectric layer such that the ferroelectric layer has a crystalline lattice structure; and
a source and a drain disposed on a second side of the aluminum oxide semiconductor layer opposite from the first side and spaced apart from one another by a distance, the source and the drain each including a metallic core, a seed layer arranged along outer sidewalls of the metal core and separating the metallic core from the aluminum oxide semiconductor layer, and a barrier layer arranged along outer sidewalls of the seed layer and separating the seed layer from the aluminum oxide semiconductor layer; and
an interlayer dielectric surrounding the gate electrode, the aluminum oxide semiconductor layer, the interfacial layer, the source, and the drain, wherein the interlayer dielectric extends continuously across the distance from an outer sidewall of the barrier layer of the source to an outer sidewall of the barrier layer of the drain, and wherein the interlayer dielectric has an upper surface that is level with an upper surface of the barrier layer of the source and is level with an upper surface of the barrier layer of the drain.

12. The semiconductor device of claim 11, wherein the ferroelectric layer is polycrystalline, and the ferroelectric layer comprises a material, where over 50% of the material is in a ferroelectric phase.

13. The semiconductor device of claim 11, wherein the ferroelectric layer comprises a first material and the aluminum oxide semiconductor layer comprises a second material, and the interfacial layer comprises a combination of the first material and the second material.

14. The semiconductor device of claim 13, wherein the interfacial layer comprises a first compositional gradient region having a first ratio of the first material to the second material and a second compositional gradient region having a second ratio of the first material to the second material, wherein the first compositional gradient region is directly between the second compositional gradient region and the ferroelectric layer, and wherein the first ratio is greater than the second ratio.

15. The semiconductor device of claim 11, wherein the aluminum oxide semiconductor layer has a first width, the ferroelectric layer has a second width, and the first width is equal to the second width.

16. The semiconductor device of claim 15, wherein the gate electrode has a third width, and the third width is equal to the second width.

17. The semiconductor device of claim 11, wherein the ferroelectric layer is confined between an outer sidewall of the source and an outer sidewall of the drain.

18. The semiconductor device of claim 11, wherein greater than 50% of the ferroelectric layer is in an orthorhombic phase.

19. The semiconductor device of claim 11, wherein the interlayer dielectric surrounds the source and the drain, the dielectric layer extends from a top of the source and the drain to a bottom surface of the gate electrode.

20. The semiconductor device of claim 11, further comprising:
a gate contact having tapered outer sidewalls and contacting a surface of the gate electrode opposite the ferroelectric layer, wherein a first portion of the gate contact has a first width that is equal to a width of the gate electrode and defined between a first portion of the tapered outer sidewalls which are nearest the gate electrode, and wherein a second portion of the gate contact has a second width defined between a second portion of the tapered outer sidewalls which are furthest from the gate electrode, the second width being less than the first width.

* * * * *